US011463810B2

(12) United States Patent
Kamata et al.

(10) Patent No.: US 11,463,810 B2
(45) Date of Patent: Oct. 4, 2022

(54) SOUND OUTPUT CONTROL APPARATUS AND SOUND OUTPUT CONTROL METHOD

(71) Applicant: SONY CORPORATION, Tokyo (JP)

(72) Inventors: Masaki Kamata, Tokyo (JP); Yasuhiro Toguri, Kanagawa (JP); Michiaki Yoneda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/981,377

(22) PCT Filed: Mar. 12, 2019

(86) PCT No.: PCT/JP2019/009854
§ 371 (c)(1),
(2) Date: Sep. 16, 2020

(87) PCT Pub. No.: WO2019/188228
PCT Pub. Date: Oct. 3, 2019

(65) Prior Publication Data
US 2021/0076136 A1    Mar. 11, 2021

(30) Foreign Application Priority Data

Mar. 26, 2018 (JP) .............................. JP2018-058430

(51) Int. Cl.
*H04R 3/12*     (2006.01)
*H03G 5/16*     (2006.01)
*H04R 1/20*     (2006.01)

(52) U.S. Cl.
CPC ................. *H04R 3/12* (2013.01); *H03G 5/16* (2013.01); *H04R 1/20* (2013.01); *H04R 2420/07* (2013.01)

(58) Field of Classification Search
CPC ........ H04R 3/12; H04R 1/20; H04R 2420/07; H04R 3/007; H04R 3/04; H03G 5/16
See application file for complete search history.

(56) References Cited

U.S. PATENT DOCUMENTS 10,063,968 B1 *  8/2018  Family .................. H04R 27/00
10,158,960 B1 * 12/2018  Møller .................... H04R 5/02
(Continued)

FOREIGN PATENT DOCUMENTS

CN       105814912 A    7/2016
JP      2000-287294 A   10/2000
(Continued)

OTHER PUBLICATIONS

International Search Report and Written Opinion of PCT Application No. PCT/JP2019/009854, dated May 28, 2019, 09 pages of ISRWO.

*Primary Examiner* — Jason R Kurr
(74) *Attorney, Agent, or Firm* — Chip Law Group

(57) ABSTRACT

The present technology relates to a sound output control apparatus and a sound output control method that perform control to prevent a balance of a system from being disturbed when reproduction is performed using a plurality of wireless speakers. A sound output control apparatus includes a transmitter that transmits first setting information regarding a sound output of the sound output control apparatus, a receiver that receives second setting information regarding a sound output of another sound output control apparatus, and a controller that controls a sound pressure or a reproduction frequency range in which reproduction is performed, on the basis of the first setting information or the second setting information. The first setting information and the second setting information each include at least information regarding a temperature, information regarding an amplitude, information regarding a remaining capacity of a power supply, and/or information regarding the reproduction frequency range.

14 Claims, 5 Drawing Sheets

(56) References Cited

U.S. PATENT DOCUMENTS

| | | | |
|---|---|---|---|
| 2006/0177073 A1* | 8/2006 | Isaac | H04R 5/02 |
| | | | 381/59 |
| 2010/0188212 A1* | 7/2010 | Jochelson | H04R 5/04 |
| | | | 340/540 |
| 2017/0013359 A1* | 1/2017 | Rin | H04R 29/001 |

FOREIGN PATENT DOCUMENTS

| | | |
|---|---|---|
| JP | 2009-038716 A | 2/2009 |
| JP | 2015-126444 A | 7/2015 |
| WO | 2015/083653 A1 | 6/2015 |

* cited by examiner

SOUND OUTPUT CONTROL APPARATUS AND SOUND OUTPUT CONTROL METHOD

CROSS REFERENCE TO RELATED APPLICATIONS

This application is a U.S. National Phase of International Patent Application No. PCT/JP2019/009854 filed on Mar. 12, 2019, which claims priority benefit of Japanese Patent Application No. JP 2018-058430 filed in the Japan Patent Office on Mar. 26, 2018. Each of the above-referenced applications is hereby incorporated herein by reference in its entirety.

TECHNICAL FIELD

The present technology relates to a sound output control apparatus, a sound output control method, and a program, and, for example, to a sound output control apparatus, a sound output control method, and a program that make it possible to perform control such that sound from a plurality of wireless speakers is appropriate.

BACKGROUND ART

Many technologies used to improve the quality of sound output from a speaker have been proposed in the past. For example, as such a technology, a technology has been proposed that makes it possible to obtain acoustic output exhibiting stable frequency characteristics by detecting impedance of a speaker, by generating sound information regarding sound exhibiting frequency characteristics corresponding to a result of the detection, and by supplying the generated sound information to the speaker (for example, see Patent Literature 1).

CITATION LIST

Patent Literature

Patent Literature 1: Japanese Patent Application Laid-open No. 2015-126444

DISCLOSURE OF INVENTION

Technical Problem

In recent years, speakers called wireless speakers have become increasingly widespread. Since there is no need to establish connection by wire for a wireless speaker, there is a lot of flexibility in where to install. A system in which a plurality of wireless speakers is set to be synchronously used has also become increasingly widespread.

For example, if control to suppress a sound pressure is performed only with respect to a specified wireless speaker in a system using a plurality of wireless speakers, this will result in an imbalance in sound in the overall system. Such an imbalance is desired to be prevented.

The present technology has been made in view of the circumstances described above, and is makes it possible to perform control such that sound from a plurality of wireless speakers is appropriate.

Solution to Problem

A sound output control apparatus according to an aspect of the present technology includes a transmitter that transmits first setting information regarding a sound output of the sound output control apparatus; a receiver that receives second setting information regarding a sound output of another sound output control apparatus; and a controller that controls a sound pressure or a reproduction frequency range in which reproduction is performed, on the basis of the first setting information or the second setting information.

A sound output control method according to an aspect of the present technology includes transmitting, by a sound output control apparatus, first setting information regarding a sound output of the sound output control apparatus; receiving, by the sound output control apparatus, second setting information regarding a sound output of another sound output control apparatus; and controlling, by the sound output control apparatus, a sound pressure or a reproduction frequency range in which reproduction is performed, on the basis of the first setting information or the second setting information.

A program according to an aspect of the present technology causes a computer to perform a process including transmitting first setting information regarding a sound output of a sound output control apparatus; receiving second setting information regarding a sound output of another sound output control apparatus; and controlling a sound pressure or a reproduction frequency range in which reproduction is performed, on the basis of the first setting information or the second setting information.

In a sound output control apparatus, a sound output control method, and a program according to an aspect of the present technology, first setting information regarding a sound output of a sound output control apparatus is transmitted, second setting information regarding a sound output of another sound output control apparatus is received, and a sound pressure or a reproduction frequency range in which reproduction is performed is controlled on the basis of the first setting information or the second setting information.

Note that the sound output control apparatus may be an independent apparatus, or may be an internal block included in a single apparatus.

Further, the program can be provided by being transmitted via a transmission medium or by being stored in a recording medium.

Advantageous Effects of Invention

An aspect of the present technology makes it possible to perform control such that sound from a plurality of wireless speakers is appropriate.

Note that the effect described here is not necessarily limitative, and any of the effects described in the present disclosure may be provided.

MODE(S) FOR CARRYING OUT THE INVENTION

Modes for carrying out the present technology (hereinafter referred to as embodiments) will now be described below.

The present technology described below is applicable to a system in which a plurality of wireless speakers is combined to output sound, or to each of the speakers. Thus, here, a system that includes a plurality of wireless speakers is described as an example.

Figure 1:
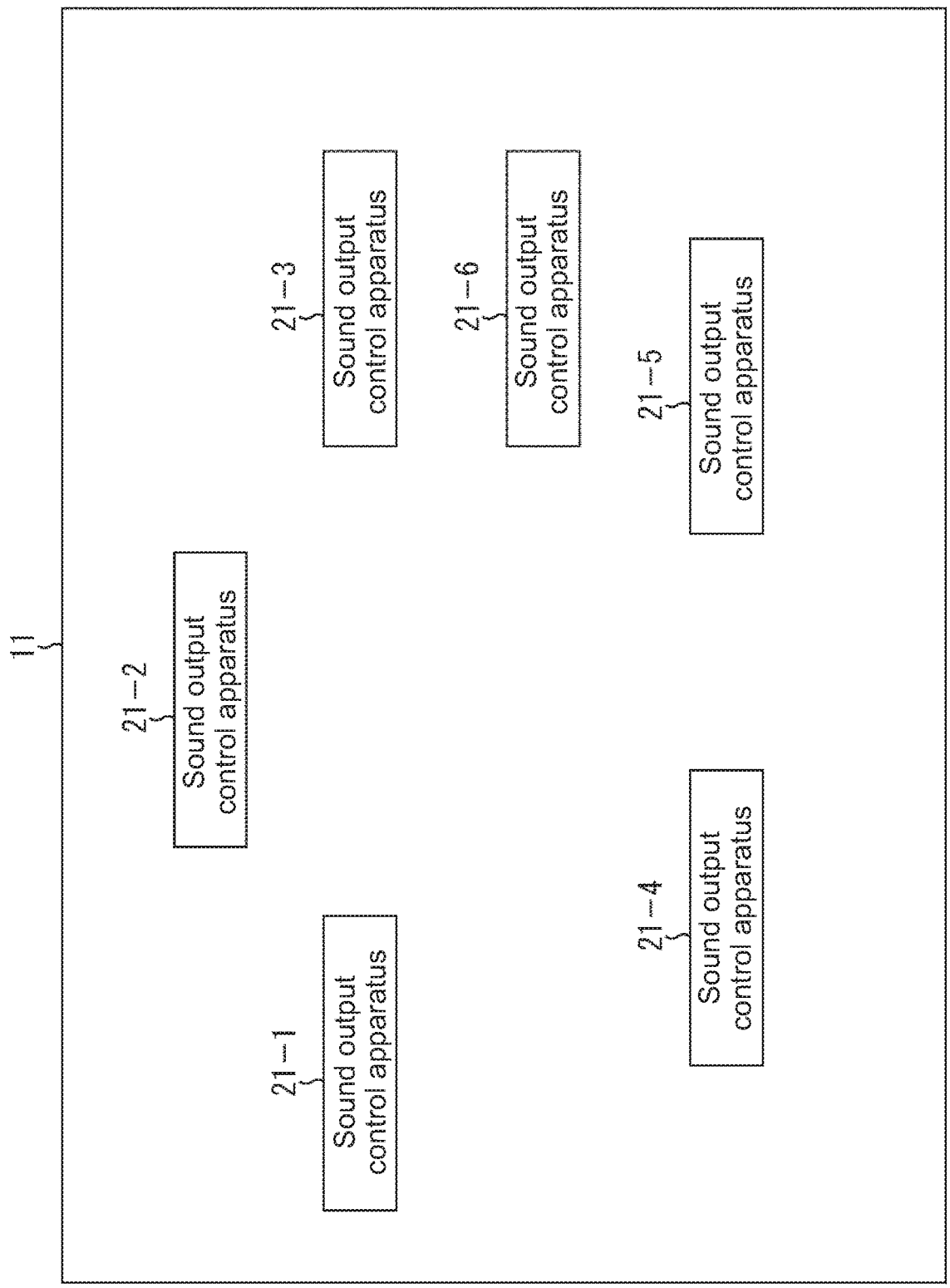
FIG. 1 illustrates a configuration of an embodiment of a system to which the present technology is applied.

FIG. 1 illustrates an example of a configuration of a system. In the system illustrated in FIG. 1, sound output control apparatuses 21-1 to 21-6 are installed in a room 11. The sound output control apparatuses 21-1 to 21-6 output sound in synchronization with one another to, for example, provide stereoscopic sound, or sound from a stereo sound source. In the following description, each of the sound output control apparatuses 21-1 to 21-6 is simply referred to as a sound output control apparatus 21 when there is no need to individually distinguish among the sound output control apparatuses 21-1 to 21-6.

Each of the sound output control apparatuses 21-1 to 21-6 is an apparatus called a wireless speaker. Conventionally, a speaker is connected to an apparatus such as a power amplifier or a preamplifier (an apparatus that includes an amplification function) by wire, such as via a speaker cable. On the other hand, each wireless speaker includes an amplification function and is wirelessly connected to another apparatus.

The other wirelessly connected apparatus is the sound output control apparatus 21, or a sound source such as a portable music player, or a CD player over a network. Here, the description is continued without a sound source being limited. Further, the description is continued on the assumption that the sound output control apparatuses 21-1 to 21-6 illustrated in FIG. 1 output sound coming from a single sound source in synchronization with one another.

Further, the sound output control apparatuses 21-1 to 21-6 each include a function of reproducing sound of a specified frequency range. The description is continued on the assumption that, in particular, the sound output control apparatus 21-6 is a speaker that is called a woofer and reproduces a bass signal. Moreover, the description is continued on the assumption that the sound output control apparatuses 21-1 to 21-5 are full-range speakers. However, for example, each of the sound output control apparatuses 21-1 to 21-5 may be a midrange speaker that reproduces a midrange signal, or may be a speaker that is called a tweeter and reproduces a high-frequency signal.

Note that, regarding the scope of application of the present technology, the present technology is applicable regardless of the frequency range of a signal reproduced by the sound output control apparatus 21, and no limitation is imposed due to the frequency range in which reproduction is performed.

<Example of Configuration of Sound Output Control Apparatus>

Figure 2:
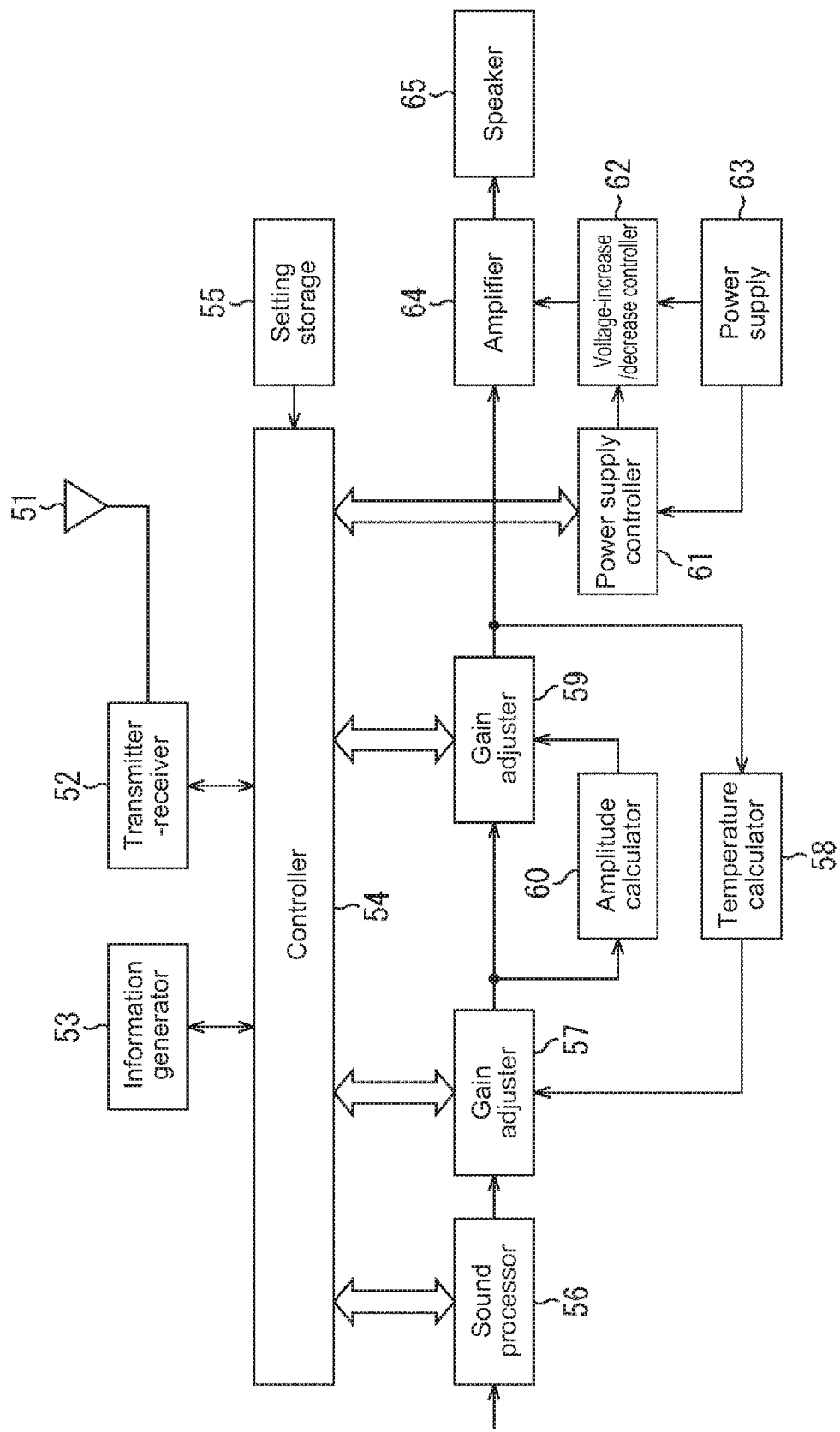
FIG. 2 illustrates an example of a configuration of a sound output control apparatus.

FIG. 2 illustrates an example of an internal configuration of the sound output control apparatus 21.

The sound output control apparatus 21 includes an antenna 51, a transmitter-receiver 52, an information generator 53, a controller 54, a setting storage 55, a sound processor 56, a gain adjuster 57, a temperature calculator 58, a gain adjuster 59, an amplitude calculator 60, a power supply controller 61, a voltage-increase/decrease controller 62, a power supply 63, an amplifier 64, and a speaker 65.

The sound output control apparatus 21 includes the antenna 51 and the transmitter-receiver 52 in order to wirelessly perform communication of data. As will be described later, when the sound output control apparatus 21 changes a gain or the like, the sound output control apparatus 21 transmits information indicating the matter to another sound output control apparatus 21, and when another sound output control apparatus 21 changes a gain or the like, the sound output control apparatus 21 receives information indicating the matter from the other sound output control apparatus 21.

The information generator 53 generates information to be transmitted to another sound output control apparatus 21, and causes the transmitter-receiver 52 to transmit the information to the other sound output control apparatus 21. The controller 54 controls each component in the sound output control apparatus 21. The setting storage 55 stores therein information such as the number of paired sound output control apparatuses 21 and a value of a gain.

The sound processor 56 acquires sound data from a sound source (not illustrated) and processes the acquired sound data. For example, when the sound output control apparatus 21 is a woofer, the sound processor 56 includes a filter that only passes a signal of a low frequency range, and performs processing using the filter. Further, when digital data is acquired, the sound processor 56 performs processing of converting the digital data into analog data.

The gain adjuster 57 adjusts a gain. Likewise, the gain adjuster 59 adjusts a gain. The sound output control apparatus 21 includes two gain adjusters. The gain adjuster 57 adjusts a gain according to temperature control information from the temperature calculator 58. The gain adjuster 59 adjusts a gain according to amplitude control information from the amplitude calculator 60.

The temperature calculator 58 calculates a temperature of the speaker 65. The speaker 65 includes a voice coil. For example, if the speaker 65 reproduces a loud sound or performs reproduction for a long time, a temperature of the voice coil will be increased and this may damage the speaker 65. Therefore, for example, a gain is reduced when there is an increase in temperature, and this results in performing control to prevent a further increase in temperature.

The temperature calculator 58 may include a temperature sensor to measure a temperature of the speaker 65 using the temperature sensor. Further, with respect to the speaker 65 to be used, a prediction formula for predicting power and a temperature may be obtained in advance to predict the temperature of the speaker 65 using such a prediction formula.

A gain is limited such that the temperature predicted (measured) by the temperature calculator 58 does not become high. Here, (information regarding) such a gain set by a temperature is referred to as the temperature control information.

The amplitude calculator 60 calculates an amplitude of the speaker 65. If the speaker 65 exhibits an excessive amplitude, for example, a high-frequency signal may be lost and this may result in distortion. Further, the excessive amplitude may also damage the speaker 65. Therefore, a gain is adjusted (an amplitude is controlled), and this results in performing control to prevent an excessive amplitude from being exhibited.

The amplitude calculator 60 analyzes a signal output from the gain adjuster 57, and determines whether it is a signal (sound) such that the speaker 65 exhibits an excessive amplitude. When the amplitude calculator 60 has determined that the speaker 65 exhibits an excessive amplitude, the amplitude calculator 60 determines a gain value such that a frequency component that is included in a signal applied to the speaker 65 and causes an excessive amplitude to be exhibited is suppressed, and supplies the gain value to the gain adjuster 59. Here, (information regarding) such a gain set by an amplitude is referred to as the amplitude control information.

In order to obtain the time necessary for the temperature calculator 58 and the amplitude calculator 60 to perform processing, a delay section that temporarily stores therein data and creates a specified delay time may be provided at a position in need of the delay section, although it is not illustrated in FIG. 2.

The power supply controller 61 monitors a state of the power supply 63, and controls the voltage-increase/decrease controller 62. The power supply 63 is a primary battery or a secondary battery, and supplies power to each component in the sound output control apparatus 21. The voltage-increase/decrease controller 62 performs control to increase or decrease a voltage supplied to the amplifier 64.

<Processing Performed by Sound Output Control Apparatus 21>

Processing performed by the sound output control apparatus 21 is described with reference to flowcharts of FIGS. 3 and 4.

It is determined in Step S11 whether to transmit information to another sound output control apparatus 21. For example, it is possible to perform a setting in which information is generated and transmitted for each specified period of time. When such a setting has been performed, it is determined whether the specified period of time has elapsed and it is time to generate and transmit information.

Further, it is also possible to perform a setting in which information is generated and transmitted when there is a change in setting. The change in setting includes a change in a set gain (a change in temperature control information) due to an increase in the temperature of the speaker 65 (due to the temperature of the speaker 65 being predicted to be increased).

Further, the change in setting includes a change in a set gain (a change in amplitude control information) due to the speaker 65 exhibiting an excessive amplitude (due to the speaker 65 being predicted to exhibit an excessive amplitude). Furthermore, the change in setting includes determining that the mode is to be changed to a power saving mode due to a reduction in a capacity of the power supply 63. A setting other than the settings described above may be performed.

Information may be transmitted for each specified period of time, or information may be transmitted when there is a change in setting. Further, when a setting in which information is transmitted for each specified period of time is performed and when a certain setting is changed, a transmission of information regarding the changed setting may be performed as interrupt processing.

When it has been determined in Step S11 that information is to be transmitted to the other sound output control apparatus 21, the process moves on to Step S12. In Step S12, information is generated by the information generator 53 and transmitted to the other sound output control apparatus 21 through the transmitter-receiver 52. For example, information regarding a sound output of the speaker 65, that is, information regarding a sound output of the sound output control apparatus 21, such as temperature control information, amplitude control information, and information regarding a remaining capacity of the power supply 63 that have been set at that point, is transmitted.

Note that the temperature control information and the amplitude control information that have been set for the sound output control apparatus 21 may be stored in the setting storage 55, and they may be updated when they are changed or may be read when information is transmitted. Further, with respect to the temperature control information and the amplitude control information for another sound output control apparatus 21, those pieces of information can also be stored in the setting storage 55 for each sound output control apparatus 21.

When the information has been transmitted to the sound output control apparatus 21 in Step S12, or when it has been determined in Step S11 that the information is not to be transmitted to the other sound output control apparatus 21, the process moves on to Step S13.

It is determined in Step S13 whether information from another sound output control apparatus 21 has been received. There is a possibility that information will be received from another sound output control apparatus 21 by the processes of Steps S11 and S12 also being performed by the other sound output control apparatus 21. When it has been determined in Step S13 that the information has not been received from the other sound output control apparatus 21, the process returns to Step S11, and the processes of and after Step S11 are repeated.

On the other hand, when it has been determined in Step S13 that the information from the other sound output control apparatus 21 has been received, the process moves on to Step S14. It is determined in Step S14 whether pieces of information from all of the paired sound output control apparatuses 21 have been received.

The paired sound output control apparatuses 21 are, for example, the sound output control apparatuses 21-1 to 21-6 illustrated in FIG. 1. When the sound output control apparatuses 21-1 to 21-6 start to be used, pairing processing is performed as an initial setting. Each of the sound output control apparatuses 21-1 to 21-5 stores, in the setting storage 55, an identifier of a paired sound output control apparatus 21.

The sound output control apparatus 21 performs the process of Step S14 by comparing the number of paired sound output control apparatuses 21 stored in the setting storage 55 with the number of sound output control apparatuses 21 from which information has been received. When it has been determined in Step S14 that the pieces of information from all of the paired sound output control apparatuses 21 have not been received, the process moves on to Step S15.

It is determined in Step S15 whether a specified period of time has elapsed. When it has been determined in Step S15 that the specified period of time has not elapsed, the process returns to Step S14, and the processes of and after Step S14 are repeated.

On the other hand, when it has been determined in Step S15 that the specified period of time has elapsed, or when it has been determined in Step S14 that the pieces of information from all of the paired sound output control apparatuses 21 have been received, the process moves on to Step S16.

Comparison with previous information is performed in Step S16. The previous information is stored in the setting storage 55. The previous information stored in the setting storage 55 and the received information are compared. The process of Step S17 is performed using a result of the comparison. In other words, it is determined in Step S17 whether to change the setting.

When the previous information and the received information are identical to each other, that is, when there is no change in information, it is determined that there is no need to change the setting. When there is a change in information, it is determined that the setting is to be changed. Further, it may also be determined that there is a change in system configuration and that the setting is to be changed when, for example, the pieces of information from all of the paired sound output control apparatuses 21 have not been received.

When it has been determined in Step S17 that there is no need to change the setting, the process returns to Step S11, and the processes of and after Step S11 are repeated. On the other hand, when it has been determined in Step S17 that there is a need to change the setting, the process moves on to Step S18.

Processing of changing a setting is performed in Step S18. The processing of changing a setting that is performed in Step S18 will be described later with reference to the flowchart of FIG. 4. The setting is changed in Step S18. When the setting has been changed, the process moves on to Step S19.

In Step S19, information including the changed setting is transmitted to the other sound output control apparatus 21. This process is similar to the process of Step S12 in principle. The information is generated by the information generator 53 and transmitted to the other sound output control apparatus 21 through the transmitter-receiver 52.

As described above, when there is a change in information, information is transmitted in order to notify another sound output control apparatus 21 of the change. Therefore, in the other sound output control apparatus 21, it has been determined that information from another sound output control apparatus 21 has been received in the process of Step S13. Then, the processes of and after Step S14 are performed.

Therefore, the setting is continuously performed in each sound output control apparatus 21 until each sound output control apparatus 21 is in a state in which there is no longer a change in setting, that is, until a system including a plurality of sound output control apparatuses 21 is steadily in an optimal state.

Here, with respect to the state in which the system is in an optimal state, a description is added. First, the description is continued using an example in which six sound output control apparatuses 21 are in operation, as illustrated in FIG. 1.

When there is a reduction in a sound pressure of one of the six sound output control apparatuses 21 (here, the description is continued on the assumption that there is a reduction in a sound pressure of the sound output control apparatus 21-1), sound from the sound output control apparatus 21-1 in which there is a reduction in sound pressure becomes soft, and thus a user may feel strange due to such a change in sound.

Therefore, for example, when the sound output control apparatus 21 in which there is a reduction in sound pressure exists in the system, a setting for preventing a user from feeling a change in sound is performed by also changing sound pressures of the other sound output control apparatuses 21. In this case, the sound pressures of the sound output control apparatuses 21-2 to 21-6 are adjusted to the sound pressure of the sound output control apparatus 21-1.

Alternatively, a setting for increasing a sound pressure of sound from the sound output control apparatus 21-2 and a sound pressure of sound from the sound output control apparatus 21-4 may be performed such that a sound from the sound output control apparatus 21-1 in which there is a reduction in sound pressure is compensated for, the sound output control apparatuses 21-2 and 21-4 being situated near the sound output control apparatus 21-1.

As described above, a setting of each sound output control apparatus 21 is performed such that a sound pressure is balanced in the overall system.

Further, the setting may be changed to a setting in which a sound pressure of a low-frequency sound of each of the sound output control apparatuses 21-1 to 21-5 is increased, when there is a reduction in a sound pressure of the sound output control apparatus 21-6 serving as a woofer due to excessive amplitude or an increase in temperature.

Further, the setting may be changed to a setting in which a sound pressure of the sound output control apparatus 21-6 is increased, when a sound pressure of a low-frequency sound is reduced in at least one of the sound output control apparatuses 21-1 to 21-5 to reduce an effect provided due to excessive amplitude or an increase in temperature.

As described above, the setting of each sound output control apparatus 21 is performed such that a sound pressure of an entire frequency range in which reproduction is performed is balanced in the overall system.

Further, with respect to the sound output control apparatuses 21-1 to 21-5, a frequency range in which reproduction is performed may be changed according to whether the sound output control apparatus 21-6 serving as a woofer exists in the system. For example, when the sound output control apparatus 21-6 is operating in the system, a setting for suppressing a low-frequency portion of a frequency range to narrow the frequency range in which reproduction is performed, is performed in each of the sound output control apparatuses 21-1 to 21-5.

Further, when it has been determined that the sound output control apparatus 21-6 is not operating (has stopped operating) in the system, a setting is performed in the sound output control apparatuses 21-1 to 21-5 such that the frequency range in which reproduction is performed is returned to a former state. Such narrowing of a frequency range in which reproduction is performed makes it possible to extend the life of the power supply 63, to reduce the possibility that an excessive amplitude will be exhibited, and to suppress an increase in temperature.

Further, for example, when, in at least one of the sound output control apparatuses 21-1 to 21-6, input of a midrange frequency is excessively performed and it is predicted that the temperature may be increased, a setting in which reproduction of a midrange frequency is suppressed in the sound output control apparatus 21 in which it has been predicted that the temperature may be increased, and reproduction of a midrange frequency is performed in another sound output control apparatus 21 with a relatively strong sound pressure, may be performed.

Note that the sound output control apparatus 21-6 from among the sound output control apparatuses 21-1 to 21-6 illustrated in FIG. 1 has been described above as a woofer. However, the sound output control apparatus 21-6 may be, for example, a tweeter. When the sound output control apparatus 21-6 is a tweeter, reproduction of a high frequency may be primarily performed by the sound output control apparatus 21-6, and, in the sound output control apparatuses 21-1 to 21-5, a high frequency may be suppressed to perform reproduction in a narrowed frequency range. In other words, the present technology is applicable regardless of a component included in the system, such as a woofer or a tweeter.

The setting is performed for each of the sound output control apparatuses 21-1 to 21-6 such that the sound output control apparatuses 21-1 to 21-6 are each capable of individually outputting an optimal sound. For example, when the sound output control apparatus 21 is a full-range speaker, the setting is performed such that the sound output control apparatus 21 is capable of outputting a low-frequency sound to a high-frequency sound. When the power source 63 is a power source such as a primary battery or a secondary battery, the voltage is set to a voltage that enables the power source 63 to supply power for as long a time as possible. Further, the setting is performed such that an excessive amplitude and an increase in the temperature of a voice coil or the like of the speaker 65 are prevented.

In principle, there is no need to change a setting of each sound output control apparatus 21 since the setting has been performed such that an optimal sound is output. In other words, the sound output control apparatus 21 does not have to change its own setting to change its state from an optimal state due to influence of another sound output control apparatus 21. However, when a plurality of sound output control apparatuses 21 is driven at the same time, as illustrated in FIG. 1, it is good if the plurality of sound output control apparatuses 21 outputs sound as a system in a balanced state.

Therefore, the setting is performed such that an optimal sound output can be performed when the sound output control apparatus 21 is individually driven, and such that an optimal sound output can be performed when a plurality of sound output control apparatuses 21 is driven. Further, when something that disturbs the balance during which the plurality of sound output control apparatuses 21 is driven, has been caused, the setting is changed to maintain the balance.

Something that disturbs the balance is caused, for example, due to a reduction in a sound pressure of at least one sound output control apparatus 21 in the system or due to driving of the sound output control apparatus 21 being stopped, as described above. Further, the changing of the setting to maintain the balance is processing such as reducing a sound pressure in conformity to another sound output control apparatus 21, maintaining a sound pressure of the system, or changing a frequency range in which reproduction is performed, as described above.

Figure 3:
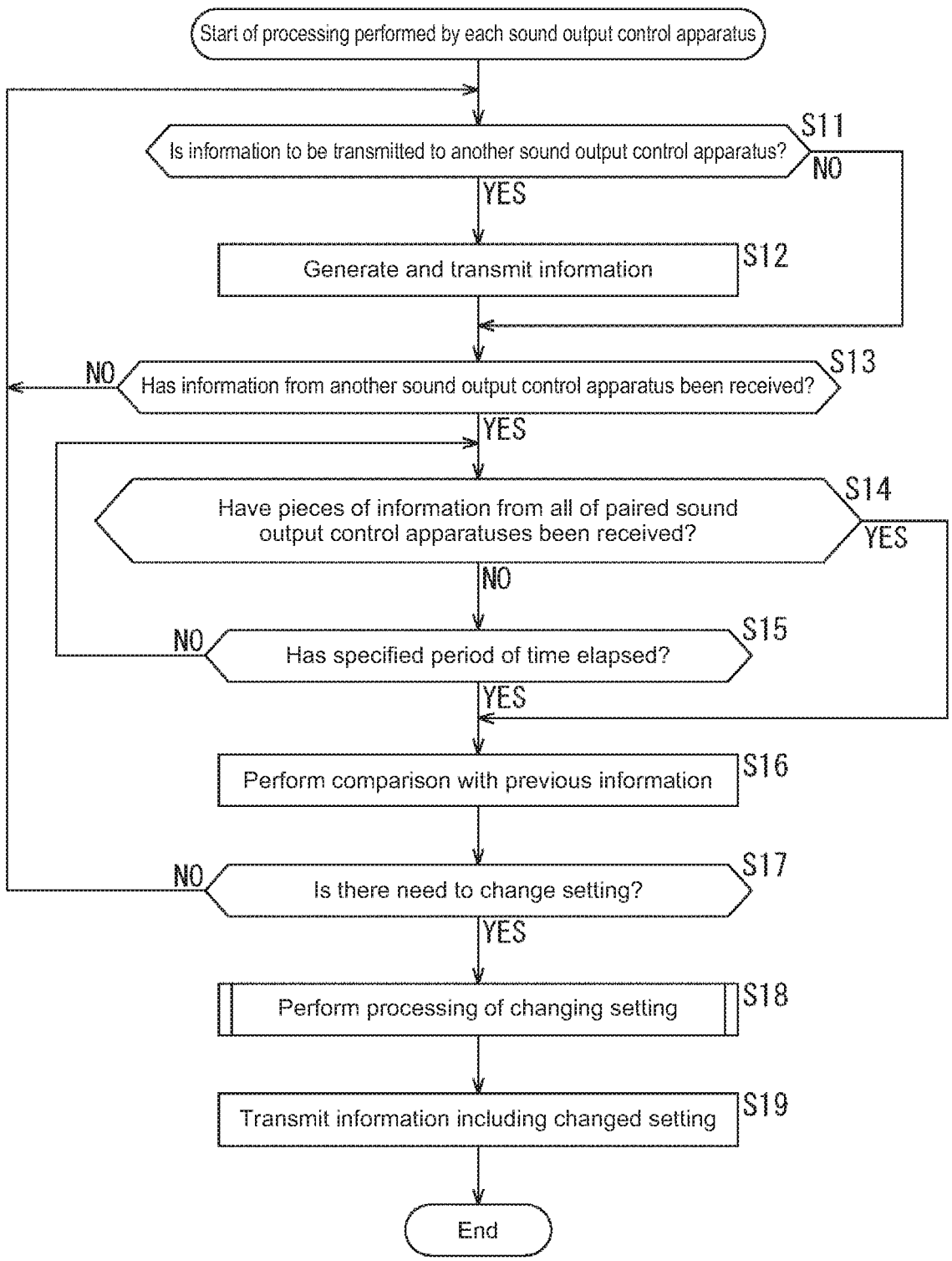
FIG. 3 is a flowchart for describing processing performed by the sound output control apparatus.

Return to the description of the flowchart of FIG. 3. When there exists the sound output control apparatus 21 having stopped operating in the system, it is possible to detect, by the processes of Steps S14 and S15 being performed, that there exists the sound output control apparatus 21 having stopped operating. Further, it is possible to detect, by the process of Step S16 being performed, whether the setting has been changed in another sound output control apparatus 21.

Furthermore, it is possible to change the setting when the balance of the system is likely to be disturbed, by determining in Step S17 whether to change the setting. For example, the setting may be changed when previous information and received information are different from each other, as described above.

Moreover, when a difference between previous information and received information such as a difference in a magnitude of a gain is not less than a specified threshold, in other words, when it has been determined that there is a great change in setting, the setting may be changed.

As described above, the sound output control apparatus 21 maintains its own setting such that the sound output control apparatus 21 can optimally output sound, and when a balance of the system is likely to be disturbed, the sound output control apparatus 21 may change the setting to prevent the balance from being disturbed.

The sound output control apparatus 21 controls itself on the basis of information regarding its own sound output. Further, the sound output control apparatus 21 controls itself on the basis of information regarding a sound output of another sound output control apparatus 21 to prevent a balance of the overall system from being disturbed.

The processing of changing a setting that is performed in Step S18 is described with reference to the flowchart of FIG. 4. The processing of changing a setting is processing of changing a setting in order to prevent a balance of the system from being disturbed when the balance of the system is likely to be disturbed, as described above.

It is determined in Step S31 whether to change a gain. For example, temperature control information and amplitude control information are pieces of information each indicating an increase or a decrease in gain. The determination processing of Step S31 is performed using the temperature control information and the amplitude control information.

When there is a difference between a value of a gain represented by the temperature control information or the amplitude control information, and a previous value of the gain (when the difference is not less than a specified threshold), it has been determined that the gain is to be changed, and the process moves on to Step S32.

The gain of the gain adjuster 57 (FIG. 2) and/or the gain of the gain adjuster 59 (FIG. 2) is changed in Step S32. When the gain is changed according to the temperature control information, the gain of the gain adjuster 57 is changed. When the gain is changed according to the amplitude control information, the gain of the gain adjuster 59 is changed.

When the gain is changed, the gain is changed to exhibit the same value as the gain represented by the temperature control information or the amplitude control information. In other words, the gain is changed to a gain set for another sound output control apparatus 21. Further, the gain may be changed taking into consideration a positional relationship with another sound output control apparatus 21, or a gain set for the sound output control apparatus 21 itself at that point.

For example, the gain may be decreased in conformity to the sound output control apparatus 21 in which there is a reduction in sound pressure, or the gain may be increased to compensate for the reduced sound pressure, as in the examples described above.

Further, in the case of a system including a plurality of sound output control apparatuses 21, as illustrated in FIG. 1, there may be a change in gain in the plurality of sound output control apparatuses 21. When it has been determined that there is a change in gain in the plurality of sound output control apparatuses 21, the gain is set on the basis of information from the sound output control apparatus 21 in which there is a greatest change in gain.

There is a good possibility that the sound output control apparatus 21 in which there is a greatest change in gain is a sound output control apparatus 21 that is more likely to be in a difficult state, that is, there is a good possibility that the sound output control apparatus 21 in which there is a greatest change in gain is a sound output control apparatus 21 that will be more likely to be damaged due to an increase in a temperature of the speaker 65 or due to the speaker 65 exhibiting an excessive amplitude. Thus, a setting is performed such that adjustment is performed in conformity to the sound output control apparatus 21 in such a difficult state.

When the gain is changed as described above, the changed gain is stored in the setting storage 55.

Note that, as described above, there is a possibility that the setting will be changed multiple times in a short period of time when the processes of Steps S13 to S19 are performed. Therefore, when the gain is changed in Step S32, the gain of the gain adjuster 57 and/or the gain of the gain adjuster 59 may be changed after a specified period of time has elapsed, that is, when processing related to the setting is completed. Regarding the timing of such a change, the same applies to a change in frequency range and a change in voltage, which will be described later.

Figure 4:
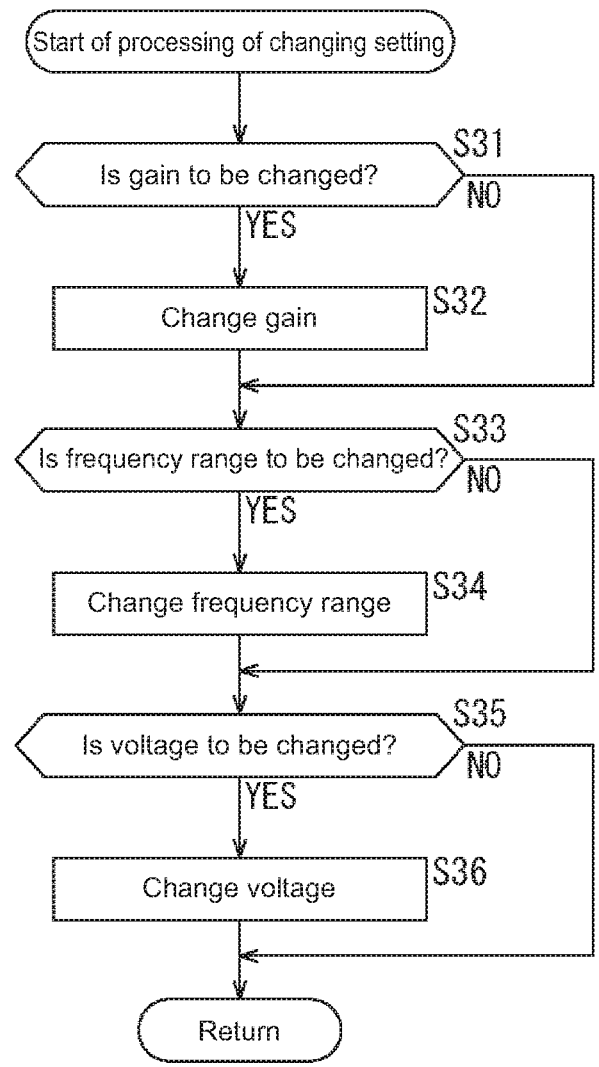
FIG. 4 is a flowchart for describing the processing performed by the sound output control apparatus.

Return to the description of the flowchart of FIG. 4. When the gain has been changed in Step S32, or when it has been determined in Step S31 that the gain is not to be changed, the process moves on to Step S33.

It is determined in Step S33 whether to change the frequency range. The frequency range is changed when the sound output control apparatus 21 is in a state in which a large number of inputs in a specified frequency range are performed and thus an excessive amplitude is likely to be exhibited, and when there is a change in the setting of a filter of the sound processor 56 in order to suppress reproduction in the specified frequency range. Further, the frequency range is changed when there exists, in the system, the sound output control apparatus 21 serving as a woofer or a tweeter that primarily performs reproduction in a specified frequency range.

With respect to the determination performed in Step S33, it is determined that the frequency range is to be changed when information from another sound output control apparatus 21 indicates that the frequency range has been changed, or when the information indicates that a woofer or a tweeter has been added to or removed from the system.

When it has been determined in Step S33 that the frequency range is to be changed, the process moves on to Step S34. The frequency range of a filter of the sound processor 56 (FIG. 2) is changed in Step S34. For example, when the information from the other sound output control apparatus 21 indicates that there is a change to narrow the frequency range, the filter of the sound processor 56 may be changed to widen the frequency range such that the narrowed frequency range is compensated for.

Further, for example, when the received information indicates that a woofer or a tweeter has been added to the system, the filter may be changed to a filter in which a frequency range covered by the woofer or the tweeter is suppressed. Furthermore, for example, when the received information indicates that the woofer or the tweeter has been removed from the system, the filter may be changed to a filter in which the frequency range covered by the woofer or the tweeter has been returned to an unsuppressed state.

As described above, when the frequency range has been changed in Step S34, or when it has been determined in Step S33 that the frequency range is not to be changed, the process moves on to Step S35.

It is determined in Step S35 whether to change the voltage. It is determined in Step S35 that the voltage is to be changed when the information from the other sound output control apparatus 21 indicates that the voltage has been changed.

When it has been determined in Step S35 that the voltage is to be changed, the process moves on to Step S36. In Step S36, the setting of the voltage-increase/decrease controller 62 is changed to a setting in which a voltage applied by the power source 63 is increased or decreased.

For example, when information is acquired that indicates that a voltage of another sound output control apparatus 21 that is situated adjacent to the sound output control apparatus 21 has been decreased, the setting may be changed to a setting in which the sound pressure of the sound output control apparatus 21 is increased. The change in the setting is performed by changing a setting to increase voltage such that a decrease in sound pressure is compensated for. The decrease in sound pressure is caused by an amplification factor of the amplifier 64 being decreased due to the decrease in the voltage of the other sound output control apparatus 21.

Further, when information is acquired that indicates that the voltage of the other sound output control apparatus 21 has been decreased, the setting may be changed to a setting in which the voltage of the sound output control apparatus 21 is also decreased in conformity to the decrease in the voltage of the other sound output control apparatus 21. As described above, voltage may be determined to be decreased or increased according to a positional relationship with another sound output control apparatus 21, or the setting may be changed to a setting identical to the setting of the other sound output control apparatus 21.

Further, processing of determining which setting is to be performed may be included in Step S36.

Furthermore, when information is acquired that indicates that the voltage of another sound output control apparatus 21 has been decreased, first, the setting may be changed to increase a voltage of the sound output control apparatus 21 such that a decrease in sound pressure that is caused due to the decrease in the voltage of the other sound output control apparatus 21 is compensated for, and the setting may be changed again after a specified period of time has elapsed, such that the voltage is identical to the voltage of the other sound output control apparatus 21.

This makes it possible to compensate for a decrease in sound pressure when the sound pressure has been decreased, and thus to prevent a user from recognizing the decrease in sound pressure. After that, a sound pressure of the overall system is decreased, and this makes it possible to prevent the user from recognizing the decrease in sound pressure and to make the sound pressure of the system stable.

As described above, the setting processing of Step S18 (FIG. 3) is performed.

As described above, the present technology makes it possible to change a setting of each sound output control apparatus 21 in order to prevent a balance of the system from being disturbed when something that disturbs the balance has been caused.

<Regarding Recording Medium>

The series of processes described above can be performed using hardware or software. When the series of processes is performed using software, a program included in the software is installed on a computer. Here, examples of the computer include a computer incorporated into dedicated hardware, and a computer such as a general-purpose personal computer that is capable of performing various functions by various programs being installed thereon.

Figure 5:
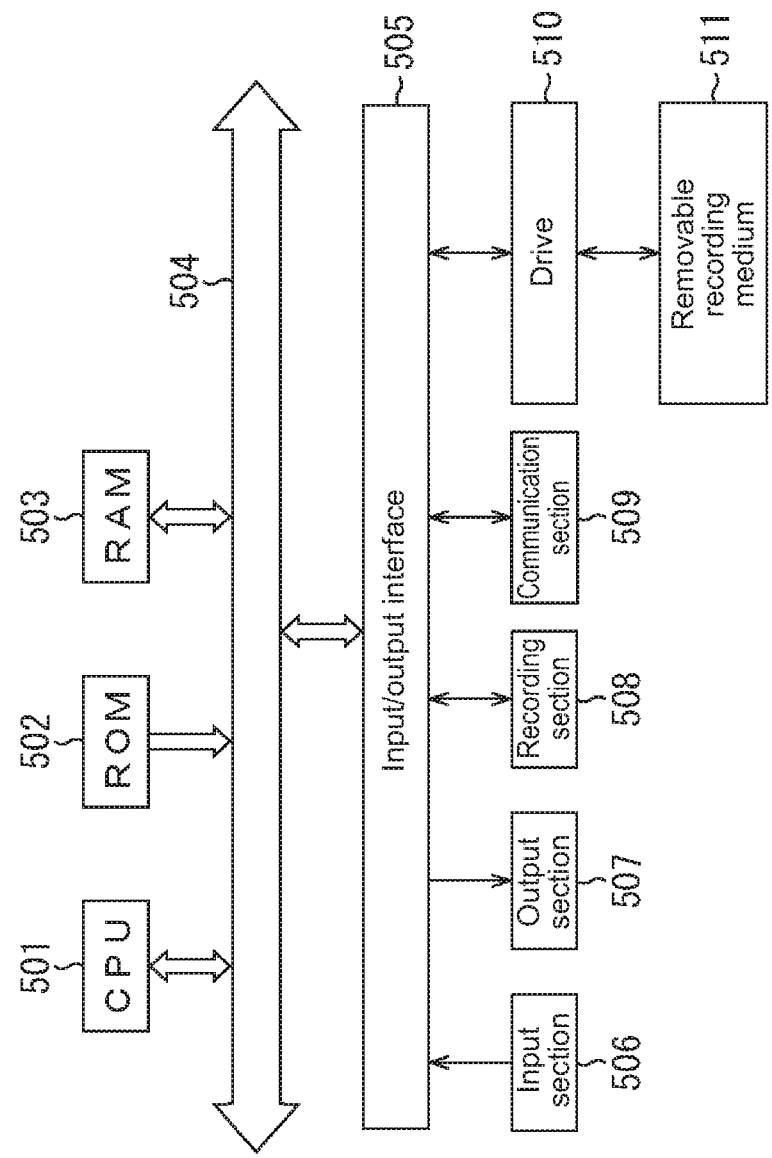
FIG. 5 is a diagram for describing a recording medium.

FIG. 5 is a block diagram of an example of a configuration of hardware of a computer that performs the series of processes described above using a program. In the computer, a central processing unit (CPU) 501, a read only memory (ROM) 502, and a random access memory (RAM) 503 are connected to one another through a bus 504. Further, an input/output interface 505 is connected to the bus 504. An input section 506, an output section 507, a storage 508, a communication section 509, and a drive 510 are connected to the input/output interface 505.

The input section 506 includes, for example, a keyboard, a mouse, and a microphone. The output section 507 includes, for example, a display and a speaker. The storage 508 includes, for example, a hard disk and a nonvolatile memory. The communication section 509 includes, for example, a network interface. The drive 510 drives a removable recording medium 511 such as a magnetic disk, an optical disk, a magneto-optical disk, or a semiconductor memory.

In the computer having the configuration described above, the series of processes described above is performed by, for example, the CPU 501 loading a program stored in the storage 508 into the RAM 503 and executing the program via the input/output interface 505 and the bus 504.

For example, the program executed by the computer (the CPU 501) can be provided by being stored in the removable recording medium 511 serving as, for example, a package medium. Further, the program can be provided via a wired or wireless transmission medium such as a local area network, the Internet, or digital satellite broadcasting.

In the computer, the program can be installed on the storage 508 via the input/output interface 505 by the removable recording medium 511 being mounted on the drive 510. Further, the program can be received by the communication section 509 via the wired or wireless transmission medium to be installed on the storage 508. Moreover, the program can be installed in advance on the ROM 502 or the storage 508.

Note that the program executed by the computer may be a program in which processes are chronologically performed in the order described herein, or may be a program in which processes are performed in parallel or a process is performed at a necessary timing such as a timing of calling.

Further, the system described herein refers to an entire apparatus that includes a plurality of apparatuses.

Note that the effects described herein are not limitative but are merely illustrative, and other effects may be provided.

Further, the embodiment of the present technology is not limited to the examples described above, and various modifications may be made thereto without departing from the scope of the present technology.

Note that the present technology may also take the following configurations.

(1) A sound output control apparatus, including:
a transmitter that transmits first setting information regarding a sound output of the sound output control apparatus;
a receiver that receives second setting information regarding a sound output of another sound output control apparatus; and a controller that controls a sound pressure or a reproduction frequency range in which reproduction is performed, on the basis of the first setting information or the second setting information.

(2) The sound output control apparatus according to (1), in which
the first setting information and the second setting information each include at least information regarding a temperature, information regarding an amplitude, information regarding a remaining capacity of a power supply, and information regarding the reproduction frequency range.

(3) The sound output control apparatus according to (2), in which
the information regarding a temperature is information regarding a gain set to be used to control a temperature of a speaker, and
when the second setting information includes the information regarding a temperature, the controller controls the sound pressure on the basis of the gain.

(4) The sound output control apparatus according to (2) or (3), in which
the information regarding an amplitude is information regarding a gain set to be used to prevent a speaker from exhibiting an excessive amplitude, and when the second setting information includes the information regarding an amplitude, the controller controls the sound pressure on the basis of the gain.

(5) The sound output control apparatus according to any one of (2) to (4), in which
the information regarding a remaining capacity of a power supply is information indicating that a voltage supplied to an amplifier has been increased or decreased, and
when the second setting information includes the information regarding a remaining capacity of a power supply, the controller controls the amplifier of the sound output control apparatus on the basis of the information indicating that the voltage has been increased or decreased.

(6) The sound output control apparatus according to any one of (2) to (5), in which
the information regarding the reproduction frequency range is information indicating that a specified reproduction frequency range in which reproduction is performed has been suppressed, and
when the second setting information includes the information regarding the reproduction frequency range, the controller performs control to increase a sound pressure in the suppressed specified reproduction frequency range.

(7) The sound output control apparatus according to any one of (2) to (6), in which
the information regarding the reproduction frequency range is information indicating that a system includes the sound output control apparatus reproducing a low-frequency sound or a high-frequency sound, and
when the second setting information includes the information regarding the reproduction frequency range, the controller performs control to suppress the reproduction frequency range for the low-frequency sound or the high-frequency sound reproduced by the sound output control apparatus included in the system.

(8) The sound output control apparatus according to (7), in which
when the controller detects that the sound output control apparatus reproducing a low-frequency sound or a high-frequency sound and being included in the system has been removed from the system, the controller returns the suppressed reproduction frequency range to an unsuppressed state.

(9) A sound output control method, including:
transmitting, by a sound output control apparatus, first setting information regarding a sound output of the sound output control apparatus;
receiving, by the sound output control apparatus, second setting information regarding a sound output of another sound output control apparatus; and
controlling, by the sound output control apparatus, a sound pressure or a reproduction frequency range in which reproduction is performed, on the basis of the first setting information or the second setting information.

(10) A program that causes a computer to perform a process including:
transmitting first setting information regarding a sound output of a sound output control apparatus;
receiving second setting information regarding a sound output of another sound output control apparatus; and
controlling a sound pressure or a reproduction frequency range in which reproduction is performed, on the basis of the first setting information or the second setting information.

REFERENCE SIGNS LIST 21 sound output control apparatus
51 antenna 52 transmitter-receiver
53 information generator
54 controller
55 setting storage
56 sound processor
57 gain adjuster
58 temperature calculator
59 gain adjuster
60 amplitude calculator
61 power supply controller
62 voltage-increase/decrease controller
63 power supply
64 amplifier
65 speaker

The invention claimed is:

1. A first sound output control apparatus, comprising:
a memory configured to store first setting information associated with a sound output of the first sound output control apparatus, and second setting information associated with a sound output of a second sound output control apparatus;
a transmitter configured to transmit the first setting information;
a receiver configured to receive third setting information associated with the sound output of the second sound output control apparatus; and
a controller configured to:
determine a change in a setting of the second sound output control apparatus based on a comparison of the second setting information and the received third setting information;
determine that a change in a setting of the first sound output control apparatus is required based on the determination of the change in the setting of the second sound output control apparatus; and
control at least one of a sound pressure or a reproduction frequency range in which reproduction is performed by the first sound output control apparatus, wherein the control is based on the determination that the change in the setting of the first sound output control apparatus is required.

2. The first sound output control apparatus according to claim 1, wherein
the first setting information comprises at least one of first temperature information associated with a temperature of the first sound output control apparatus, first amplitude information associated with an amplitude of the first sound output control apparatus, first power information associated with a remaining capacity of a power supply of the first sound output control apparatus, and first frequency range information associated with the reproduction frequency range of the first sound output control apparatus,
the second setting information comprises at least one of second temperature information associated with the temperature of the second sound output control apparatus, second amplitude information associated with the amplitude of the second sound output control apparatus, second power information associated with the remaining capacity of the power supply of the second sound output control apparatus, and second frequency range information associated with the reproduction frequency range of the second sound output control apparatus, and
the third setting information comprises at least one of third temperature information associated with the temperature of the second sound output control apparatus, third amplitude information associated with the amplitude of the second sound output control apparatus, third power information associated with the remaining capacity of the power supply of the second sound output control apparatus, and third frequency range information associated with the reproduction frequency range of the second sound output control apparatus.

3. The first sound output control apparatus according to claim 2, wherein the controller is further configured to:
change the first setting information based on the determination that the change in the setting of the first sound output control apparatus is required;
change a gain of the first sound output control apparatus based on the change in the first setting information, wherein the first setting information indicates a gain set to be used to control a temperature of a speaker of the first sound output control apparatus; and
control the sound pressure of the first sound output control apparatus based on the change in the gain of the first sound output control apparatus.

4. The first sound output control apparatus according to claim 2, wherein the controller is further configured to:
change the first setting information based on the determination that the change in the setting of the first sound output control apparatus is required;
change a gain of the first sound output control apparatus based on the change in the first setting information, wherein
the first setting information indicates information regarding the amplitude of the first sound output control apparatus, and
the information regarding the amplitude indicates a gain set to be used to prevent a speaker of the first sound output control apparatus from exceeding a threshold amplitude; and
control the sound pressure of the first sound output control apparatus based on the change in the gain of the first sound output control apparatus.

5. The first sound output control apparatus according to claim 2, wherein
the first power information indicates that a voltage supplied to an amplifier of the first sound output control apparatus is changed, and
the controller is further configured to control an amplification factor of the amplifier of the first sound output control apparatus based on the supplied voltage.

6. The first sound output control apparatus according to claim 2, wherein
the first frequency range information indicates that a specified reproduction frequency range, in which the reproduction is performed, is suppressed, and
the controller is further configured to increase the sound pressure in the suppressed specified reproduction frequency range.

7. The first sound output control apparatus according to claim 2, wherein
the second frequency range information indicates that a system includes a third sound output control apparatus that reproduces one of a low-frequency sound or a high-frequency sound, and
the controller is further configured to suppress the reproduction frequency range for one of the low-frequency sound or the high-frequency sound reproduced by the first sound output control apparatus included in the system.

8. The first sound output control apparatus according to claim 7, wherein the controller is further configured to:

detect that the third sound output control apparatus is removed from the system; and return the suppressed reproduction frequency range to an unsuppressed state based on the detection that the third sound output control apparatus is removed from the system.

9. The first sound output control apparatus according to claim 1, wherein the controller is further configured to determine that the setting of the first sound output control apparatus is to be changed based on whether a difference between the first setting information and the third setting information is greater than a threshold.

10. The first sound output control apparatus according to claim 1, wherein
the second setting information is received prior to the third setting information.

11. The first sound output control apparatus according to claim 1, wherein the controller is further configured to control one of the sound pressure or the reproduction frequency range based on the first setting information.

12. The first sound output control apparatus according to claim 1, wherein
the memory is further configured to store an identifier of each second sound output control apparatus of a plurality of second sound output control apparatuses including the second sound output control apparatus,
the controller is further configured to:
compare a first number of second sound output control apparatuses, of the plurality of second sound output control apparatuses, that has transmitted a setting information with a second number of second sound output control apparatuses, of the plurality of second sound output control apparatuses, whose identifier is stored in the memory; and
determine that the change in the setting of the first sound output control apparatus is required based on a mismatch between the first number of the second sound output control apparatuses and the second number of the second sound output control apparatuses.

13. A sound output control method, comprising:
storing, in a memory, first setting information associated with a sound output of a first sound output control apparatus, and a second setting information associated with a sound output of a second sound output control apparatus;
transmitting, by the first sound output control apparatus, the first setting information;

receiving, by the first sound output control apparatus, third setting information associated with the sound output of the second sound output control apparatus;
determining a change in a setting of the second sound output control apparatus based on a comparison of the second setting information and the received third setting information;
determining, by the first sound output control apparatus, that a change in a setting of the first sound output control apparatus is required based on the determination of the change in the setting of the second sound output control apparatus; and
controlling, by the first sound output control apparatus, at least one of a sound pressure or a reproduction frequency range in which reproduction is performed by the first sound output control apparatus, wherein the control is based on the determination that the change in the setting of the first sound output control apparatus is required.

14. A non-transitory computer-readable medium having stored thereon computer-executable instructions which, when executed by a computer, cause the computer to execute operations, the operations comprising:
storing, in a memory, first setting information associated with a sound output of a first sound output control apparatus, and a second setting information associated with a sound output of a second sound output control apparatus;
transmitting, by the first sound output control apparatus, the first setting information;
receiving, by the first sound output control apparatus, third setting information associated with the sound output of the second sound output control apparatus;
determining a change in a setting of the second sound output control apparatus based on a comparison of the second setting information and the received third setting information;
determining, by the first sound output control apparatus, that a change in a setting of the first sound output control apparatus is required based on the determination of the change in the first setting of the second sound output control apparatus; and
controlling, by the first sound output control apparatus, at least one of a sound pressure or a reproduction frequency range in which reproduction is performed by the first sound output control apparatus, wherein the control is based on the determination that the change in the setting of the first sound output control apparatus is required.

* * * * *